United States Patent
Dono et al.

(10) Patent No.: US 11,067,628 B2
(45) Date of Patent: Jul. 20, 2021

(54) REPLICATION OF A FIRST INTERFACE ONTO A SECOND INTERFACE AND RELATED SYSTEMS, METHODS, AND DEVICES

(71) Applicant: Micron Technology, Inc., Boise, ID (US)

(72) Inventors: Chiaki Dono, Tokyo (JP); Chikara Kondo, Tokyo (JP); Ryo Fujimaki, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/577,267

(22) Filed: Sep. 20, 2019

(65) Prior Publication Data

US 2021/0088583 A1    Mar. 25, 2021

(51) Int. Cl.
| | |
|---|---|
| *G01R 31/00* | (2006.01) |
| *G01R 31/3177* | (2006.01) |
| *G11C 29/12* | (2006.01) |
| *H01L 25/18* | (2006.01) |
| *G11C 11/4093* | (2006.01) |

(52) U.S. Cl.
CPC ...... *G01R 31/3177* (2013.01); *G11C 11/4093* (2013.01); *G11C 29/12* (2013.01); *H01L 25/18* (2013.01)

(58) Field of Classification Search
None
See application file for complete search history.

(56) References Cited

U.S. PATENT DOCUMENTS

| | | | | |
|---|---|---|---|---|
| 7,203,873 | B1* | 4/2007 | Adams | G11C 29/1201 714/31 |
| 8,386,864 | B2* | 2/2013 | Dubey | G11C 29/16 714/727 |
| 10,365,325 | B2 | 7/2019 | Dono | |
| 2004/0187058 | A1* | 9/2004 | Yamada | G01R 31/318572 714/726 |
| 2004/0232936 | A1* | 11/2004 | Limaye | G01R 31/318552 324/750.3 |

(Continued)

OTHER PUBLICATIONS

C. Chou, J. Li, Y. Yu, C. Lo, D. Kwai and Y. Chou, "Hierarchical Test Integration Methodology for 3-D ICs," in IEEE Design & Test, vol. 32, No. 4, pp. 59-70, Aug. 2015, doi: 10.1109/MDAT.2015.2427257. (Year: 2015).*

*Primary Examiner* — Daniel F. McMahon
(74) *Attorney, Agent, or Firm* — TraskBritt

(57) ABSTRACT

Disclosed herein are systems, methods, and devices that enable access to a first interface control circuit via test probes of a second interface. In some embodiments a memory device includes a first interface including first ports that are inaccessible to a test probe. The memory device also includes a first interface control circuit configured to control operation of the first interface. The memory device further includes a second interface including second ports. At least a portion of the second ports include test pads that are accessible to the test probe. In addition, the memory device includes a multiplexer configured to operably couple the first interface and at least a portion of the second interface to the first interface control circuit. The multiplexer is configured to selectively enable test probe access to the first interface control circuit via the test pads.

20 Claims, 5 Drawing Sheets

(56) References Cited

U.S. PATENT DOCUMENTS

2014/0167799 A1\* 6/2014 Wang .................. H05K 1/11
  324/750.14
2019/0066816 A1  2/2019 Dono \* cited by examiner

REPLICATION OF A FIRST INTERFACE ONTO A SECOND INTERFACE AND RELATED SYSTEMS, METHODS, AND DEVICES

TECHNICAL FIELD

The present disclosure relates, generally, to mapping ports of a first interface onto ports of a second interface, and more specifically to mapping ports of a P1500 interface to ports of a direct access (DA) interface in a memory device.

BACKGROUND

The Joint Electron Device Engineering Council (JEDEC) Solid State Technology Association regulates the acceptability of designs of interfaces in memory devices. For example, JEDEC defines three interfaces for high-bandwidth memory 2 (HBM2) systems. Specifically, JEDEC defines an AWORD/DWORD interface (e.g., command, address, DQ, etc.), a P1500 interface, and a direct access (DA) interface. The DA interface is a special interface for vendor's test. JEDEC only defines the number and placement of ubumps for the DA interface. Accordingly, port assignment usage may vary (e.g., vendor specific).

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
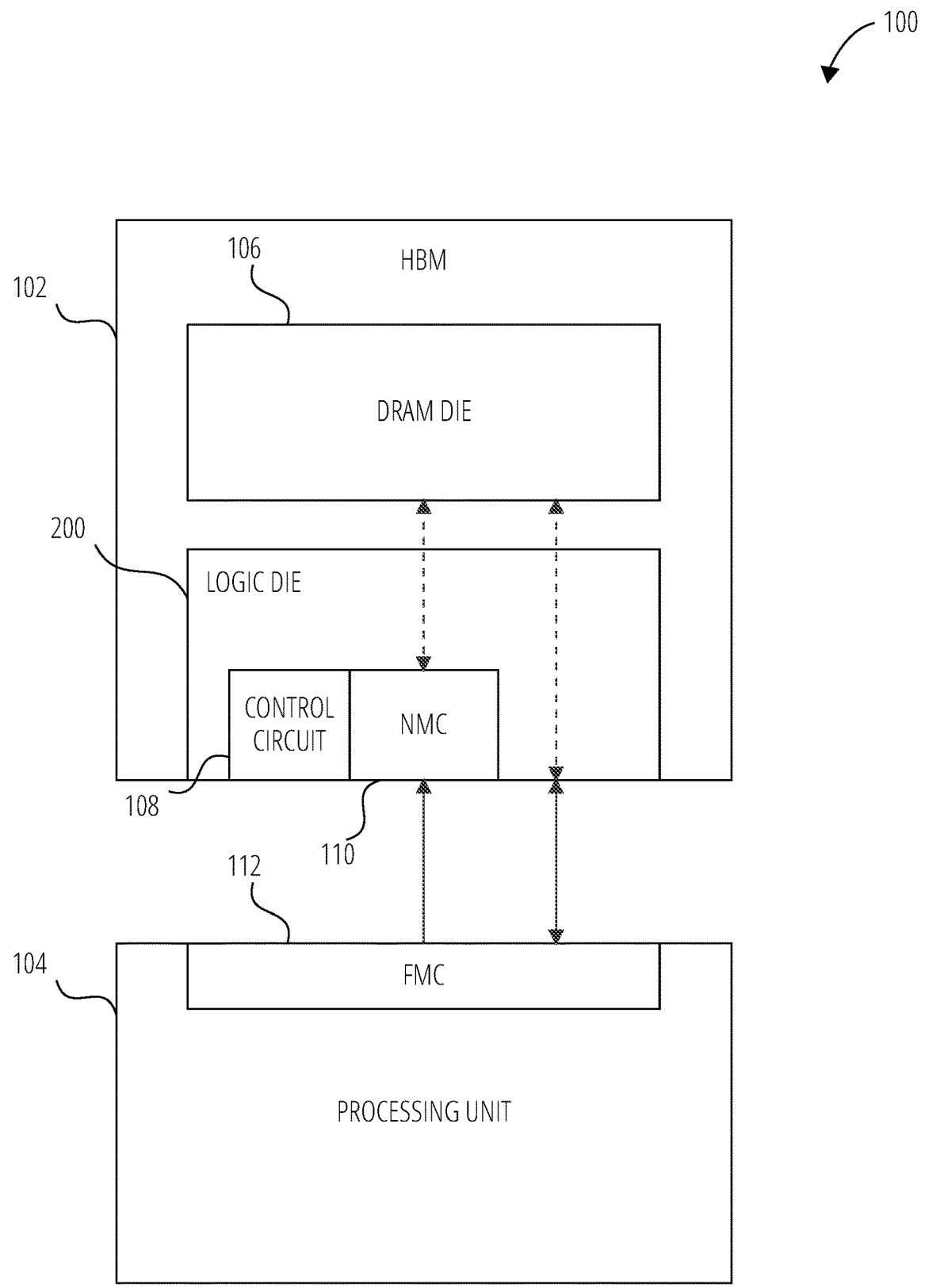
FIG. 1 is a block diagram of a high-bandwidth memory HBM+ system 100, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

The JEDEC regulates the P1500 interface to have only ubumps. As a result, the P1500 interface does not include test pads that can be accessed by a test probe. As a result, a P1500 control circuit operably coupled to the P1500 interface may not be verified directly from the P1500 interface, even though it is desirable to verify the P1500 control circuit using a probe test. In contrast, the JEDEC allows the DA interface to include test pads in addition to ubumps. Accordingly, the DA interface may be tested using test probes.

Disclosed herein are systems, methods, and devices that enable access to the P1500 control circuit via test probes of a DA interface. In some embodiments a memory device includes a first interface including first ports that are inaccessible to a test probe. The memory device also includes a first interface control circuit configured to control operation of the first interface. The memory device further includes a second interface including second ports. At least a portion of the second ports includes test pads that are accessible to the test probe. In addition, the memory device includes a multiplexer configured to operably couple the first interface and at least a portion of the second interface to the first interface control circuit. The multiplexer is configured to selectively enable the at least the portion of the second interface to operate as a portal to the first interface to enable test probe access to the first interface control circuit via the test pads of the second interface.

In some embodiments a method of verifying a first interface control circuit of a logic die for a memory device includes operably coupling first ports of a first interface to a first interface control circuit, the first ports inaccessible to a test probe. The method also includes operably coupling at least a portion of second ports of a second interface to the first interface control circuit responsive to a control signal. The second ports are accessible to the test probe. The method further includes testing operation of the first interface control circuit using the at least the portion of the second ports.

In some embodiments a computing system includes one or more memory devices. At least one memory device of the one or more memory devices includes a logic die and a memory die (e.g., a DRAM die). The logic die includes a P1500 interface operably coupled to a P1500 control circuit and a direct access (DA) interface operably coupled to a DA control circuit. The logic die is configured to selectively operably couple at least a portion of test pads of the DA interface to the P1500 control circuit. The memory die includes data storage elements. The memory die is operably coupled to the P1500 control circuit and to the DA control circuit of the logic die.

FIG. 1 is a block diagram of an HBM+ system 100, according to some embodiments. The HBM+ system 100 includes an HBM 102 and a processing unit 104 (e.g., a central processing unit (CPU), a graphics processing unit (GPU), an accelerated processing unit (APU), etc.) operably coupled to the HBM 102. The HBM 102 includes multiple (e.g., four, eight, sixteen, thirty-two) dynamic random access memory dice, in the form of DRAM dice 106 and a logic die 200. The logic die 200 includes a control circuit 108 and a near memory controller, NMC 110. The processing unit 104 includes a far memory controller, FMC 112.

The NMC 110 and the FMC 112 are configured to function as memory controller masters. The FMC 112 includes an off-HBM memory controller and the NMC 110 includes an on-HBM memory controller that is located on the logic die 200 of the HBM 102. By way of non-limiting example, the logic die 200 may correspond to a bottom layer of a 3D-stack of memory plus logic that is the HBM 102, while the multiple DRAM dice 106 may correspond to the upper layers of the HBM 102. The logic die 200 may control the DRAM dice 106 using the NMC 110, which may be instructed by the control circuit 108 to control the DRAM dice 106. It should be noted that either or both of the NMC 110 and the FMC 112 may be represented by a general memory controller.

The logic die 200 includes a P1500 interface operably coupled to a P1500 control circuit. The logic die 200 also includes a direct access interface operably coupled to a DA interface control circuit. The logic die 200 is configured to selectively operably couple at least a portion of test pads of the DA interface, which includes test pads, to the P1500 control circuit to enable the DA interface to operate as a P1500 interface. As a result, the DA interface may enable test probe access to the P1500 control circuit, which may enable the P1500 control circuit to be verified in a probe test.

Figure 2:
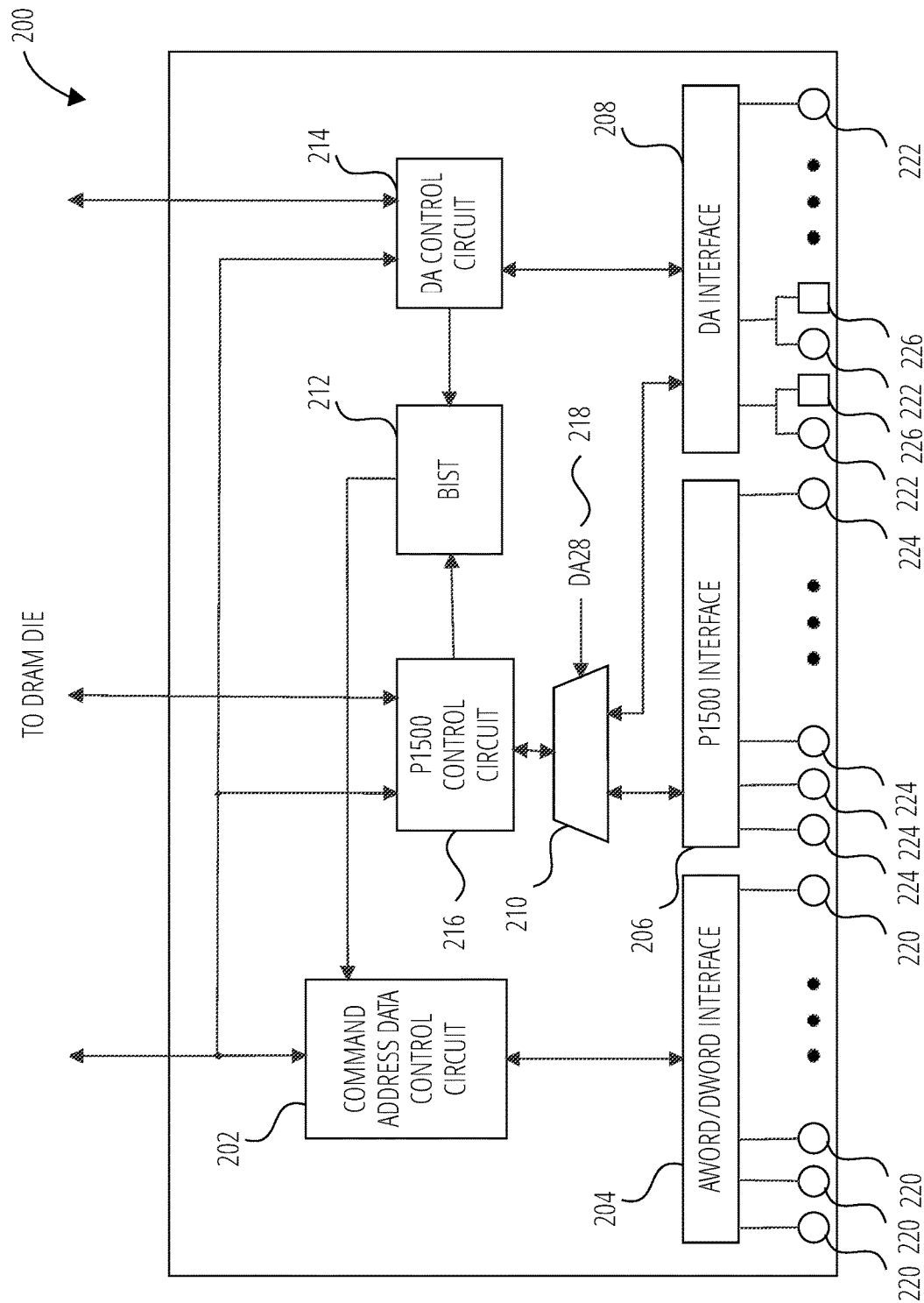
FIG. 2 is a block diagram of a logic die of the HBM+ system of FIG. 1.

FIG. 2 is a block diagram of a logic die 200 of the HBM+ system 100 of FIG. 1. The logic die 200 includes an AWORD/DWORD interface 204, a P1500 interface 206, and a direct access interface, DA interface 208. The logic die 200 also includes a command address data control circuit 202 operably coupled to the AWORD/DWORD interface 204, a P1500 control circuit 216 operably coupled to the P1500 interface 206 via a multiplexer 210, and a DA control circuit 214 operably coupled to the DA interface 208. The command address data control circuit 202 is configured to control operation of the AWORD/DWORD interface 204, the P1500 control circuit 216 is configured to control operation of the P1500 interface 206, and the DA control circuit 214 is configured to control operation of the DA interface 208. Each of the command address data control circuit 202, the P1500 control circuit 216, and the DA control circuit 214 is configured to communicate directly with the DRAM die 106 (FIG. 1). The P1500 control circuit 216 and the DA control circuit 214 are also configured to communicate indirectly with the DRAM die 106 via a built in self test, BIST 212. Furthermore, the P1500 control circuit 216 and the DA control circuit 214 are configured to engage in hybrid communications with the DRAM die 106, wherein the hybrid communications include both direct and indirect (via the BIST 212) communications with the DRAM dice 106.

The AWORD/DWORD interface 204 is an interface for providing address/command (AWORD) and data (DWORD) for a normal operation of the HBM 102 of FIG. 1. By way of non-limiting example, the AWORD/DWORD interface 204 is configured to serve as an interface for conducting operational signals (e.g., commands, address signals, DQ input/output data signals, etc.). The AWORD/DWORD interface 204 includes AWORD/DWORD ports 220. The AWORD/DWORD ports 220 do not include test pads.

The P1500 interface 206 is an interface for testing operations specified by JEDEC. The P1500 interface 206 includes P1500 ports 224. A number of the P1500 ports 224, as specified by JEDEC, is fifteen P1500 ports 224. The P1500 test interface is a test interface between an embedded core and a system chip, which may be used to test core interoperability. The JEDEC specifies that the P1500 interface include ubumps, but not test pads. Accordingly, during test operations involving the P1500 interface, the P1500 control circuit 216 may not be accessed with a test probe via the P1500 ports 224. Functions and circuits (e.g., P1500 control circuit 216) of P1500 interfaces between various different HBMs may be relatively similar because the JEDEC closely regulates the P1500 interface 206.

The DA interface 208 is an interface for other operations (e.g., mainly test operations). The basic role of the DA interface 208 is to verify functions of the HBM (e.g., the HBM+ system 100 of FIG. 1) without using the other interfaces (e.g., the AWORD/DWORD interface 204, the P1500 interface 206). The DA interface 208 includes DA ports 222. At least some of the DA ports 222 have test pads 226. A number of the DA ports 222 is sixty DA ports 222. Functions and circuits (e.g., the DA control circuit 214) for the DA interface 208 may be relatively different from one HBM to another because the functions and circuits of the DA interface 208 are not as closely regulated as those of the P1500 interface 206. For example, JEDEC defines the number and placement of ubumps of the DA ports 222. Port assignment and usage of the DA interface 208 however, may vary from one HBM to another.

Since the AWORD/DWORD interface 204 and the P1500 interface 206 do not include test pads, of the AWORD/DWORD interface 204, the P1500 interface 206, and the DA interface 208, only the DA interface 208 includes test pads. The multiplexer 210 is configured to enable probe access of the P1500 control circuit 216 via the test pads 226 of the DA interface 208. In other words, the P1500 ports 224 may be assigned onto a portion of the DA ports 222. As a result, the P1500 control circuit 216 may include a dual interface (i.e., the P1500 interface 206 and the DA interface 208).

Either the P1500 interface 206 or the DA interface 208 may be selected to be operably coupled to the P1500 control circuit 216 via the multiplexer 210 responsive to a DA28 signal 218 (e.g., a signal on a DA28 port of the DA ports 222, which may be numbered DA0 through DA59). The DA28 signal 218 may be a control signal (e.g., provided by a memory controller to one of the DA ports 222). By way of non-limiting example, when the DA28 signal 218 is de-asserted (e.g., held at a logic level low voltage potential), the multiplexer 210 may be configured to operably couple the P1500 interface 206 to the P1500 control circuit 216. Also, when the DA28 signal 218 is asserted (e.g., held at a logic level high voltage potential), the multiplexer 210 may be configured to operably couple the DA interface 208 to the P1500 control circuit 216. Of course in some embodiments the DA28 signal 218 may instead be asserted to operably couple the P1500 interface 206 to the P1500 control circuit 216 and the DA28 signal 218 may be de-asserted to operably couple the DA interface 208 to the P1500 control circuit 216 without departing from embodiments disclosed herein.

Since the number of the DA ports 222 (sixty DA ports 222) is greater than the number of the P1500 ports 224 (fifteen P1500 ports 224), each of the P1500 ports 224 may be assigned to a different one of the DA ports 222. As a result, fifteen of the sixty DA ports 222 may be set up to function as P1500 ports 224. Also, the functions of the P1500 control circuit 216 may be expanded while operably coupled to the DA interface 208 because the number of the DA ports 222 is greater than the number of the P1500 ports 224.

Another benefit resulting from the dual interface capability of the P1500 control circuit 216 is that where the logic die 200 is implemented on a system in package (SiP), a probe test may be run to test the P1500 control circuit 216. This probe test may guarantee P1500 functionality (e.g., perfect P1500 functionality). Also, the P1500 protocol may be used via the DA interface 208 even if the P1500 interface 206 is disabled.

In FIG. 2 various arrows indicating directions of signals are shown. It should be noted that address/command signals and the corresponding test signals are driven from outside the logic die 200 toward the DRAM die 106 (FIG. 1) in one direction. On the other hand, data signals and the corresponding test signals are driven in both directions (i.e., to and from the DRAM die 106).

Figure 3:
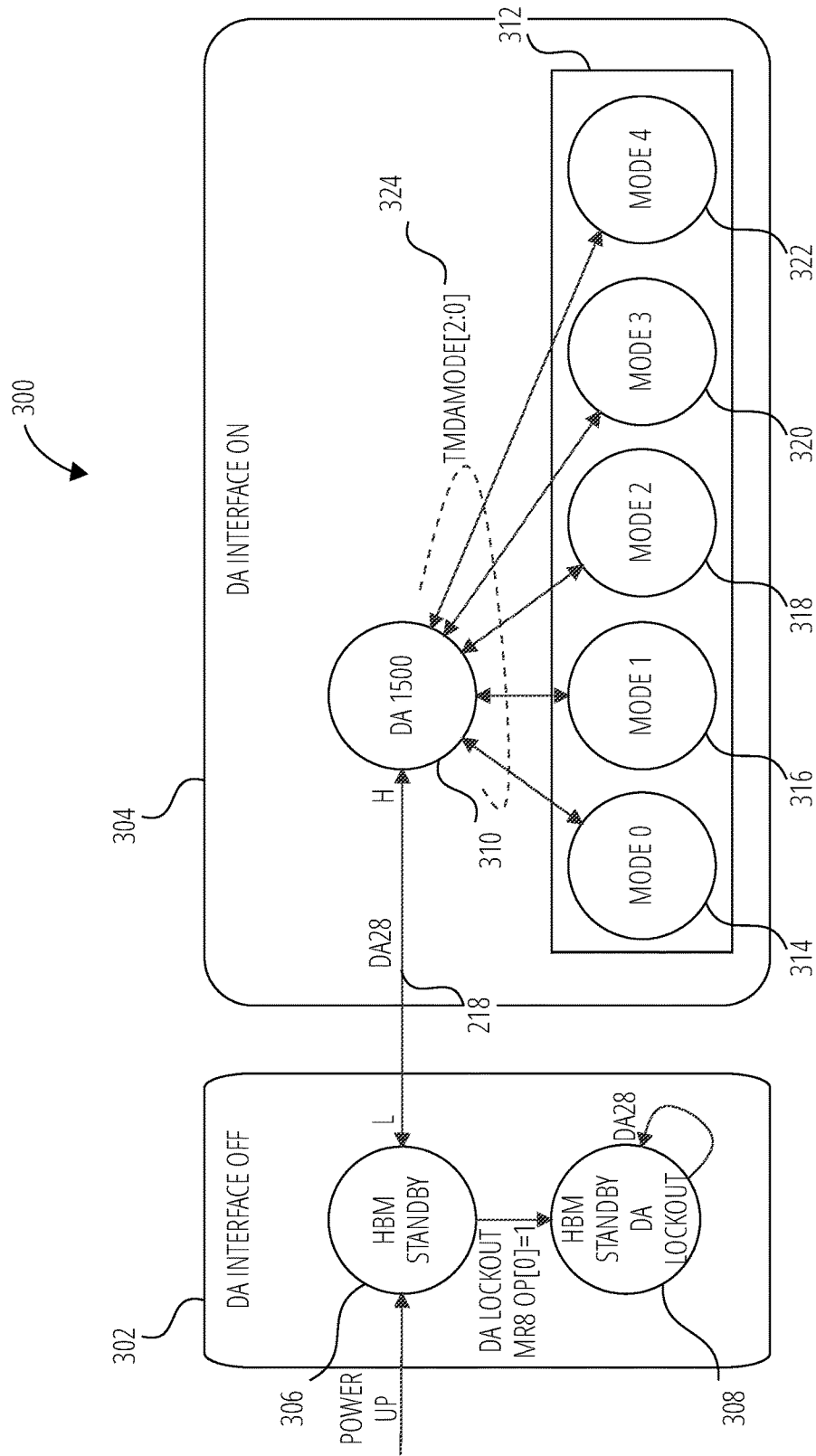
FIG. 3 is a functional flow diagram of a DA control circuit of the logic die of FIG. 2, according to some embodiments.

FIG. 3 is a functional flow diagram 300 of a DA control circuit 214 of the logic die 200 of FIG. 2, according to some embodiments. The functional flow diagram 300 includes operation modes HBM standby mode 306, HBM standby DA lockout mode 308, DA 1500 mode 310, and test modes 312 (e.g., mode 0 314, mode 1 316, mode 2 318, mode 3 320, mode 4 322). During the HBM standby mode 306 and the HBM standby DA lockout mode 308 the DA control circuit 214 may be operating in a DA interface off mode 302. In the DA 1500 mode 310 and the test modes 312, the DA control circuit 214 may operate in a DA interface on mode 304. Switching between the DA interface off mode 302 and the DA interface on mode 304 is controlled by the DA28 signal 218. When the DA28 signal 218 is at a logic level high voltage potential (H), the DA control circuit 214 is enabled (e.g., the DA interface on mode 304), and when the DA28 signal 218 is at a logic level low voltage potential (L), the DA control circuit 214 is disabled (e.g., the DA interface off mode 302). As previously discussed, the DA28 signal 218 is provided to the multiplexer 210 to transfer signals received at the DA ports 222 to the P1500 control circuit 216 and realize functions thereof.

As illustrated by the functional flow diagram 300, upon power up, the logic die 200 may operate in an HBM standby mode 306. While in the HBM standby mode 306, if a DA lockout signal is asserted (e.g., via MR8 OP[0]=1), the DA control circuit 214 may transition to an HBM standby DA lockout mode 308. If, however, the DA28 signal 218 is asserted high (H), the DA control circuit 214 may transition to a DA 1500 mode 310, during which the DA interface 208 is operably coupled to the P1500 control circuit 216 via the multiplexer 210 (FIG. 2).

With the DA control circuit 214 operating in the DA interface on mode 304 and the DA interface 208 operably coupled to the P1500 control circuit 216, the DA control circuit 214 may transition to any of various test modes 312 responsive to a tmDAMode[2:0] signal 324.

While the DA control circuit 214 is operating in the DA 1500 mode 310, when the DA28 signal 218 is de-asserted to the logic level low voltage potential (L), the DA control circuit 214 transitions to the HBM standby mode 306 within the DA interface off mode 302.

Figure 4:
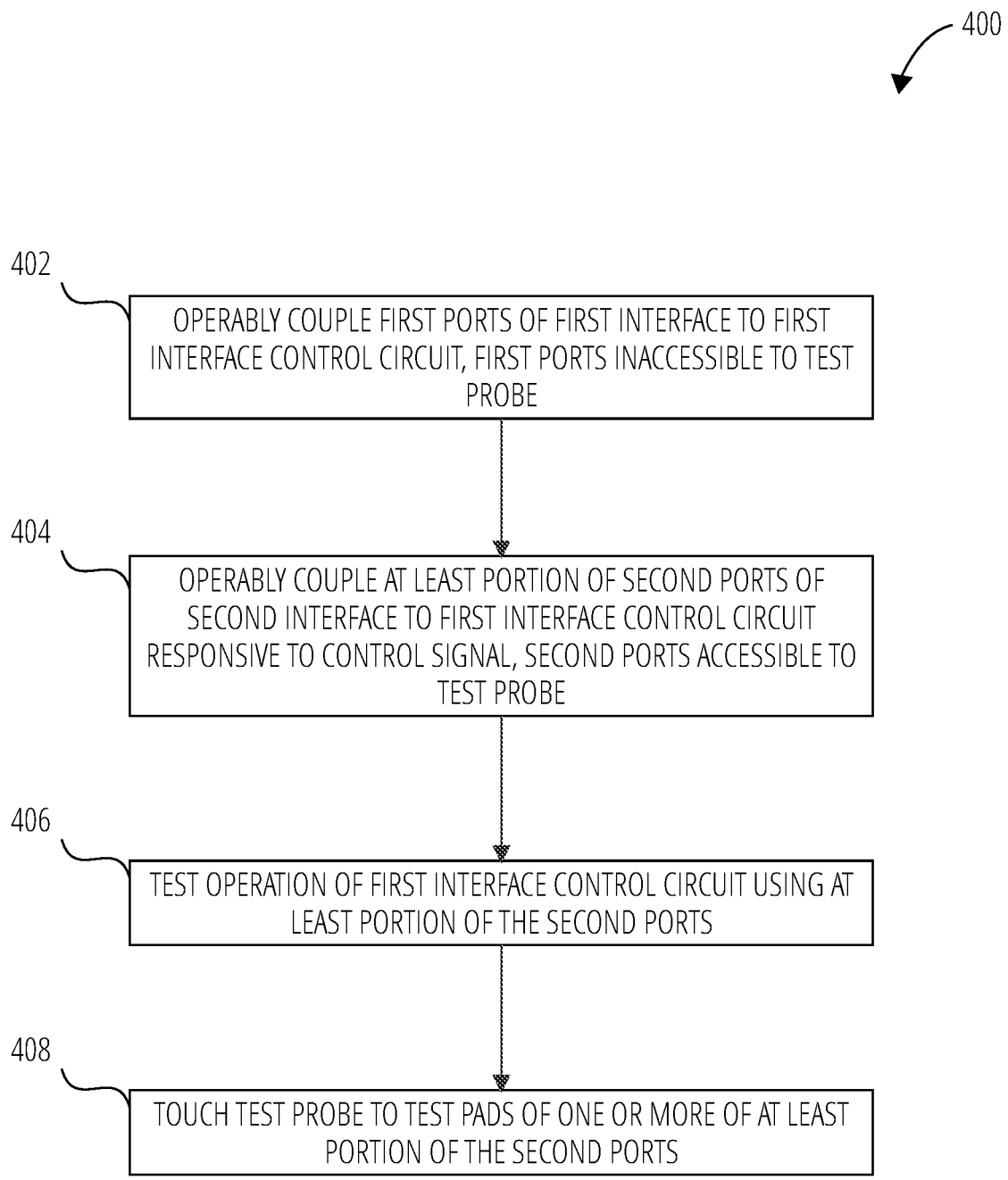
FIG. 4 is a flowchart illustrating a method of verifying a first interface control circuit, according to some embodiments.

FIG. 4 is a flowchart illustrating a method 400 of verifying a first interface control circuit (e.g., the P1500 control circuit 216 of FIG. 2), according to some embodiments. In operation 402, method 400 operably couples first ports of a first interface to a first interface control circuit. The first ports are inaccessible to a test probe (e.g., because the first ports are ubumps). In some embodiments the first interface control circuit includes the P1500 control circuit 216 and the first ports include the P1500 ports 224. In some embodiments operably coupling the first ports to the first interface includes isolating the first interface from a second interface (e.g., a DA interface 208). In some embodiments operably coupling the first ports to the first interface includes operating a second control circuit operably coupled to a second interface in a DA interface off mode 302 (FIG. 3).

In operation 404, method 400 operably couples at least a portion of second ports of a second interface to the first interface control circuit responsive to a control signal, the second ports accessible to the test probe. In some embodiments the control signal may be a control signal provided to one of the second ports (e.g., a DA28 signal 218). In some embodiments operably coupling at least a portion of the second ports of the second interface to the first interface control circuit includes operably coupling at least a portion of DA ports 222 of a DA interface 208 to a P1500 control circuit 216 via a multiplexer 210 responsive to the DA28 signal 218 (FIG. 2). In some embodiments operably coupling at least a portion of the second ports of the second interface to the first control circuit includes the DA control circuit 214 transitioning from a DA interface off mode 302 to a DA interface on mode 304. In some embodiments operably coupling the at least the portion of the second ports of the second interface to the first interface control circuit responsive to the control signal includes operating a multiplexer operably coupled to the first interface and the second interface to assign the first ports of the first interface onto the at least the portion of the second ports of the second interface responsive to the control signal.

In operation 406, method 400 tests operation of the first interface control circuit using the at least the portion of the second ports. In operation 408, method 400 touches the test probe to test pads of the one or more of the at least the portion of the second ports.

Figure 5:
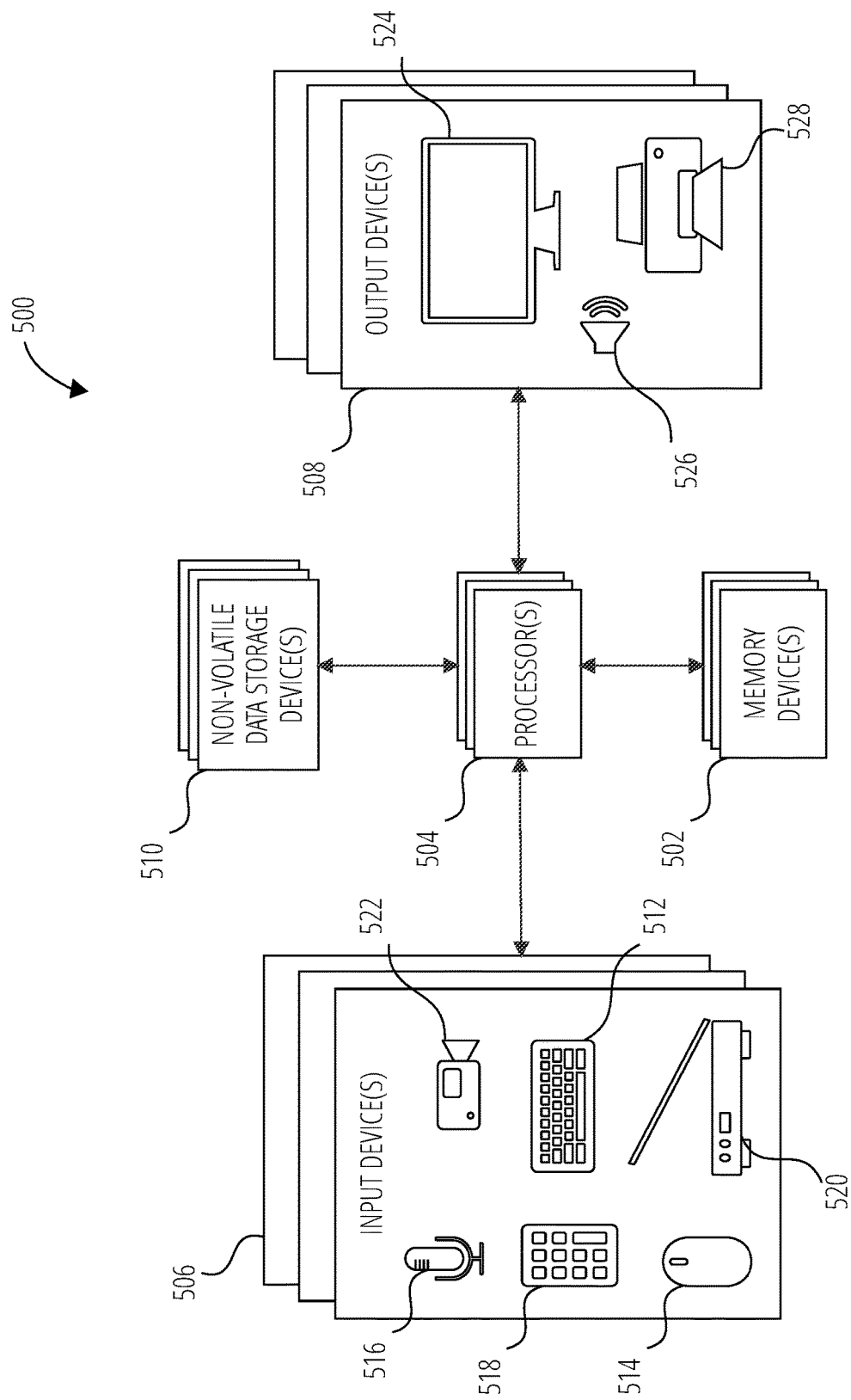
FIG. 5 is a block diagram of a computing system, according to some embodiments.

FIG. 5 is a block diagram of a computing system 500, according to some embodiments. The computing system 500 includes one or more processors 504 operably coupled to one or more memory devices 502, one or more non-volatile data storage devices 510, one or more input devices 506, and one or more output devices 508. In some embodiments the computing system 500 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 504 may include a central processing unit (CPU) or other processor configured to control the computing system 500. In some embodiments the one or more memory devices 502 include random access memory (RAM), such as volatile data storage (e.g., dynamic RAM (DRAM) static RAM (SRAM), etc.). In some embodiments the one or more non-volatile data storage devices 510 include a hard drive, a solid state drive, Flash memory, erasable programmable read only memory (EPROM), other non-volatile data storage devices, or any combination thereof. In some embodiments the input devices 506 include a keyboard 512, a pointing device 514 (e.g., a mouse, a track pad, etc.), a microphone 516, a keypad 518, a scanner 520, a camera 522, other input devices, or any combination thereof. In some embodiments the output devices 508 include an electronic display 524, a speaker 526, a printer 528, other output devices, or any combination thereof.

In some embodiments at least one of the memory devices 502 includes the HBM+ system 100. For example, at least one of the memory devices 502 may include a logic die (e.g., the logic die 200 of FIG. 1 and FIG. 2) including a P1500 interface (e.g., the P1500 interface 206 of FIG. 2) operably coupled to a P1500 control circuit (e.g., the P1500 control circuit 216 of FIG. 2) and a direct access (DA) interface (e.g., the DA interface 208 of FIG. 2) operably coupled to a DA control circuit (e.g., the DA control circuit 214 of FIG. 2), the logic die configured to selectively operably couple at least a portion of test pads (e.g., test pads 226 of FIG. 2) of the DA interface to the P1500 control circuit (e.g., via the multiplexer 210 responsive to the DA28 signal 218). The at least one of the memory devices 502 may also include one or more memory dice (e.g., DRAM dice 106 of FIG. 1) including data storage elements (e.g., capacitive data storage elements). The one or more memory dice are operably coupled to the P1500 control circuit and the DA control circuit.

In some embodiments the computing system 500 includes a system in package (SiP). The SiP includes the at least one memory device of the one or more memory devices 502. In some embodiments the DA interface is configured to operate in place of the P1500 interface as the P1500 interface during a disabled state of the P1500 interface.

Various embodiments have been discussed above. These embodiments enable easy P1500 control circuit (e.g., the P1500 control circuit 216) verification via a probe test. Also, these embodiments enable expansion of P1500 functionality with additional DA ports (e.g., the DA ports 222). Further, these embodiments enable running of the same tests between a probe test and a SiP test. In addition, these embodiments enable use of the P1500 protocol via the DA interface (e.g., the DA interface 208 of FIG. 2) even when the primary P1500 interface (e.g., the P1500 control circuit 216 of FIG. 2) in midstack is disabled.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A memory device, comprising:
    a first interface including first ports that are not directly accessible to a test probe, the first ports configured to enable electrical access to the first interface from external to the memory device;
    a first interface control circuit configured to control operation of the first interface;
    a second interface including second ports, at least a portion of the second ports including test pads that are accessible to the test probe, the second ports configured to enable electrical access to the second interface from external to the memory device; and
    a multiplexer configured to operably couple the first interface and at least a portion of the second interface to the first interface control circuit, wherein the multiplexer is configured to selectively enable the at least the portion of the second interface to operate as the first interface to enable test probe access to the first interface control circuit via the test pads of the second interface.

2. The memory device of claim 1, wherein the first ports comprise microbumps.

3. The memory device of claim 1, wherein the first interface includes a P1500 interface and the first interface control circuit includes a P1500 control circuit.

4. The memory device of claim 1, wherein the second interface includes a direct access (DA) interface.

5. The memory device of claim 1, further comprising a second interface control circuit operably coupled to the second interface, the second interface control circuit configured to control operation of the second interface.

6. The memory device of claim 5, wherein the second interface control circuit is configured to selectively access one or more dynamic random access memory (DRAM) dice of the memory device directly, indirectly via a built in self test (BIST), and in a hybrid manner including direct access of the DRAM die and indirect access of the DRAM die via the BIST.

7. The memory device of claim 1, wherein the multiplexer is configured to selectively operate the at least the portion of the second interface as the first interface responsive to a control signal provided to the multiplexer.

8. The memory device of claim 7, wherein a second interface control circuit operably coupled to the second interface is configured to be disabled responsive to the control signal provided to the multiplexer.

9. The memory device of claim 1, wherein the multiplexer is configured to assign each of the first ports to a different one of the second ports during the selective operation of at least the portion of the second interface as the first interface.

10. The memory device of claim 1, wherein a number of the first ports is fifteen.

11. The memory device of claim 1, wherein a number of the second ports is sixty.

12. The memory device of claim 1, wherein the first interface control circuit is configured to selectively access one or more dynamic random access memory (DRAM) dice directly, indirectly via a built in self test (BIST), and in a hybrid manner including direct access of the one or more DRAM dice and indirect access of the one or more DRAM dice via the BIST.

13. A method of verifying a first interface control circuit of a logic die for a memory device, the method comprising:
operably coupling first ports of a first interface to the first interface control circuit, the first ports not directly accessible to a test probe, the first ports configured to enable electrical access to the first interface from external to the memory device;
operably coupling at least a portion of second ports of a second interface to the first interface control circuit responsive to a control signal, the second ports accessible to the test probe, the second ports configured to enable electrical access to the second interface from external to the memory device; and
testing operation of the first interface control circuit using the at least the portion of the second ports.

14. The method of claim 13, wherein operably coupling the at least the portion of the second ports of the second interface to the first interface control circuit responsive to the control signal comprises operating a multiplexer operably coupled to the first interface and the second interface to assign the first ports of the first interface onto the at least the portion of the second ports of the second interface responsive to the control signal.

15. The method of claim 13, wherein testing operation of the first interface control circuit using the at least the portion of the second ports comprises making contact with a test probe to one or more of the at least the portion of the second ports.

16. The method of claim 15, wherein making contact with a test probe to the one or more of the at least the portion of the second ports comprises making contact with the test probe to test pads of the one or more of the at least the portion of the second ports.

17. The method of claim 13, wherein the first interface includes a P1500 interface and the second interface includes a direct access (DA) interface.

18. A computing system, comprising:
one or more memory devices, at least one memory device of the one or more memory devices including:
a logic die including a P1500 interface operably coupled to a P1500 control circuit and a direct access (DA) interface operably coupled to a DA control circuit, the logic die configured to selectively operably couple at least a portion of test pads of the DA interface to the P1500 control circuit; and
at least one memory die including data storage elements, the at least one memory die operably coupled to the P1500 control circuit and to the DA control circuit.

19. The computing system of claim 18, wherein the computing system comprises a system in package (SiP), the SiP including the at least one memory device, wherein the DA interface is configured to operate in place of the P1500 interface as the P1500 interface during a disabled state of the P1500 interface.

20. The computing system of claim 18, further comprising:
one or more processors operably coupled to the one or more memory devices;
one or more non-volatile data storage devices operably coupled to the one or more processors;
one or more input devices operably coupled to the one or more processors; and
one or more output devices operably coupled to the one or more processors.

* * * * *